(12) United States Patent
Kimura et al.

(10) Patent No.: US 11,955,403 B2
(45) Date of Patent: Apr. 9, 2024

(54) HEADER FOR SEMICONDUCTOR PACKAGE AND SEMICONDUCTOR PACKAGE

(71) Applicant: SHINKO ELECTRIC INDUSTRIES CO., LTD., Nagano (JP)

(72) Inventors: Yasuyuki Kimura, Nagano (JP); Takumi Ikeda, Nagano (JP)

(73) Assignee: SHINKO ELECTRIC INDUSTRIES CO., LTD., Nagano (JP)

( * ) Notice: Subject to any disclaimer, the term of this patent is extended or adjusted under 35 U.S.C. 154(b) by 356 days.

(21) Appl. No.: 17/206,275

(22) Filed: Mar. 19, 2021

(65) Prior Publication Data

US 2021/0305478 A1 Sep. 30, 2021

(30) Foreign Application Priority Data

Mar. 24, 2020 (JP) .................................. 2020-052653

(51) Int. Cl.
*H01L 23/373* (2006.01)
*H01L 23/31* (2006.01)
(Continued)

(52) U.S. Cl.
CPC ............ *H01L 23/373* (2013.01); *H01L 23/31* (2013.01); *H01L 23/367* (2013.01); *H01L 23/38* (2013.01);
(Continued)

(58) Field of Classification Search
CPC ..... H01L 23/367; H01L 23/373; H01L 23/38; H01L 33/483; H01L 33/641;
(Continued)

(56) References Cited

U.S. PATENT DOCUMENTS 8,233,512 B2 * 7/2012 Tamaya ............... H01S 5/02345
372/50.12
2004/0126066 A1 * 7/2004 Keh ...................... G02B 6/4279
385/92
(Continued)

FOREIGN PATENT DOCUMENTS

CN 108390255 8/2018
JP 2006-041234 2/2006
(Continued)

OTHER PUBLICATIONS

Office Action dated Jul. 11, 2023 with respect to the corresponding Japanese patent application No. 2020-052653.
(Continued)

*Primary Examiner* — Herve-Louis Y Assouman
*Assistant Examiner* — Christopher M Roland
(74) *Attorney, Agent, or Firm* — IPUSA, PLLC (57) ABSTRACT

A header for a semiconductor package includes: an eyelet having an upper surface and a lower surface; a first metal block molded integrally with the eyelet, protruding at the upper surface, and having a substantially U shape; a first lead sealed in a first through hole penetrating the eyelet; a first substrate having a front surface formed with a first signal pattern electrically connected to the first lead and having a back surface fixed to a first end surface of the first metal block; a second lead sealed in a second through hole penetrating the eyelet; and a second substrate having a front surface formed with a second signal pattern electrically connected to the second lead and having a back surface fixed to a second end surface of the first metal block.

7 Claims, 10 Drawing Sheets

(51) Int. Cl.
*H01L 23/367* (2006.01)
*H01L 23/38* (2006.01)
*H01L 33/48* (2010.01)
*H01L 33/64* (2010.01)
*H01S 5/0231* (2021.01)
*H01S 5/02315* (2021.01)

(52) U.S. Cl.
CPC .......... *H01L 33/483* (2013.01); *H01L 33/641* (2013.01); *H01S 5/0231* (2021.01); *H01S 5/02315* (2021.01)

(58) Field of Classification Search
CPC ... H01L 33/642; H01L 33/645; H01S 5/0231; H01S 5/02315
See application file for complete search history.

(56) References Cited

U.S. PATENT DOCUMENTS

| | | | | |
|---|---|---|---|---|
| 2005/0047460 A1* | 3/2005 | Go | .................. | H01S 5/02212 372/36 |
| 2005/0089070 A1* | 4/2005 | Honda | .................. | H01S 5/02212 372/36 |
| 2005/0100064 A1* | 5/2005 | Stewart | .................. | H01S 5/02212 372/36 |
| 2005/0105572 A1* | 5/2005 | Simoun-Ou | .................. | H01S 5/02212 372/38.1 |
| 2005/0111503 A1* | 5/2005 | Ishigami | .................. | H01S 5/02345 372/38.1 |
| 2006/0176918 A1* | 8/2006 | Aruga | .................. | H01S 5/02345 372/38.1 |
| 2007/0228535 A1* | 10/2007 | Fujino | .................. | H01S 5/0231 257/678 |
| 2008/0013576 A1 | 1/2008 | Honda | | |
| 2008/0137699 A1 | 6/2008 | Aruga | | |
| 2016/0352069 A1* | 12/2016 | Kimura | .................. | H01S 5/02212 |
| 2017/0093123 A1* | 3/2017 | Takizawa | .................. | H01S 5/0233 |
| 2017/0133821 A1* | 5/2017 | Kimura | .................. | H01S 5/02469 |
| 2018/0194134 A1 | 7/2018 | Kawakubo et al. | | |
| 2020/0067265 A1* | 2/2020 | Hettler | .................. | H01L 23/10 |
| 2020/0287347 A1 | 9/2020 | Wang | | |
| 2021/0271038 A1* | 9/2021 | Noguchi | .................. | G02B 6/4274 |
| 2021/0305472 A1* | 9/2021 | Kimura | .................. | H01S 5/02315 |
| 2022/0069544 A1* | 3/2022 | Wai Li | .................. | H01L 23/04 |
| 2022/0238980 A1* | 7/2022 | Drögemüller | .................. | H01S 5/06226 |

FOREIGN PATENT DOCUMENTS

| | | |
|---|---|---|
| JP | 2006-216839 | 8/2006 |
| JP | 2011-108939 | 6/2011 |
| JP | 2016-189431 | 11/2016 |
| JP | 2021-077858 | 5/2021 |
| JP | 2022-116383 | 8/2022 |
| WO | 2003/081735 | 10/2003 |

OTHER PUBLICATIONS

Office Action dated Sep. 14, 2023 issued with respect to the related U.S. Appl. No. 17/197,434.

Office Action dated Jul. 11, 2023 with respect to the corresponding Japanese patent application No. 2020-052652.

* cited by examiner

HEADER FOR SEMICONDUCTOR PACKAGE AND SEMICONDUCTOR PACKAGE

CROSS-REFERENCE TO RELATED APPLICATION

This application is based upon and claims priority to Japanese Patent Application No. 2020-052653, filed on Mar. 24, 2020, the entire contents of which are incorporated herein by reference.

FIELD

The present disclosure relates to a header for a semiconductor package and a semiconductor package.

BACKGROUND

There are various types of light emitting devices. For example, an Electro-absorption Modulator integrated with DFB Laser (EML), a Directly Modulated Laser (DML), or the like is an example of known light emitting devices. These light emitting devices may be used for optical communication, for example.

In order to stabilize the oscillation wavelength of the light emitting devices described above, a Peltier device, which is a temperature regulator, may be mounted in a package. In this case, the length of a transmission line in the package becomes long due to the mounting of the Peltier device, thereby requiring a relay substrate that takes the transmission losses into consideration, and a metal block for holding the relay substrate. The relay substrate and the metal block may be arranged on an eyelet.

RELATED-ART DOCUMENTS

Patent Documents

[Patent Document 1] Japanese Laid-open Patent Publication No. 2011-108939

Although the metal block for holding the relay substrate may be made separately from the eyelet and joined to the eyelet by a brazing material or the like, it is preferable to mold the metal block integrally with the eyelet by stamping or the like from the viewpoint of improving productivity or the like. However, since the above-described metal block protrudes on the eyelet, depending on the shape of the metal block, it is difficult to mold it integrally with the eyelet by stamping or the like.

In view of the above, the present invention has an object to provide a header for a semiconductor package including a metal block with a shape that can be molded integrally with an eyelet.

SUMMARY

A header for a semiconductor package includes: an eyelet having an upper surface and a lower surface; a first metal block molded integrally with the eyelet, protruding at the upper surface of the eyelet, and having a substantially U shape viewed from a normal direction of the upper surface of the eyelet; a first lead sealed in a first through hole penetrating the eyelet from the upper surface to the lower surface of the eyelet; a first substrate having a front surface formed with a first signal pattern electrically connected to the first lead and having a back surface that is an opposite side surface of the front surface, the back surface being fixed to a first end surface of the first metal block; a second lead sealed in a second through hole penetrating the eyelet from the upper surface to the lower surface of the eyelet; and a second substrate having a front surface formed with a second signal pattern electrically connected to the second lead and having a back surface that is an opposite side surface of the front surface of the second substrate, the back surface of the second substrate being fixed to a second end surface of the first metal block.

According to the present disclosure, it is possible to provide a header for a semiconductor package including a metal block with a shape that can be molded integrally with an eyelet.

The object and advantages of the invention will be realized and attained by means of the elements and combinations particularly pointed out in the claims.

It is to be understood that both the foregoing general description and the following detailed description are exemplary and explanatory and not restrictive of the invention, as claimed.

DESCRIPTION OF EMBODIMENTS

In the following, embodiments will be described with reference to the accompanying drawings. It should be noted that in the drawings, same constituent elements may be referred to by the same reference numerals, and duplicate descriptions may be omitted as appropriate.

First Embodiment

Figure 1:
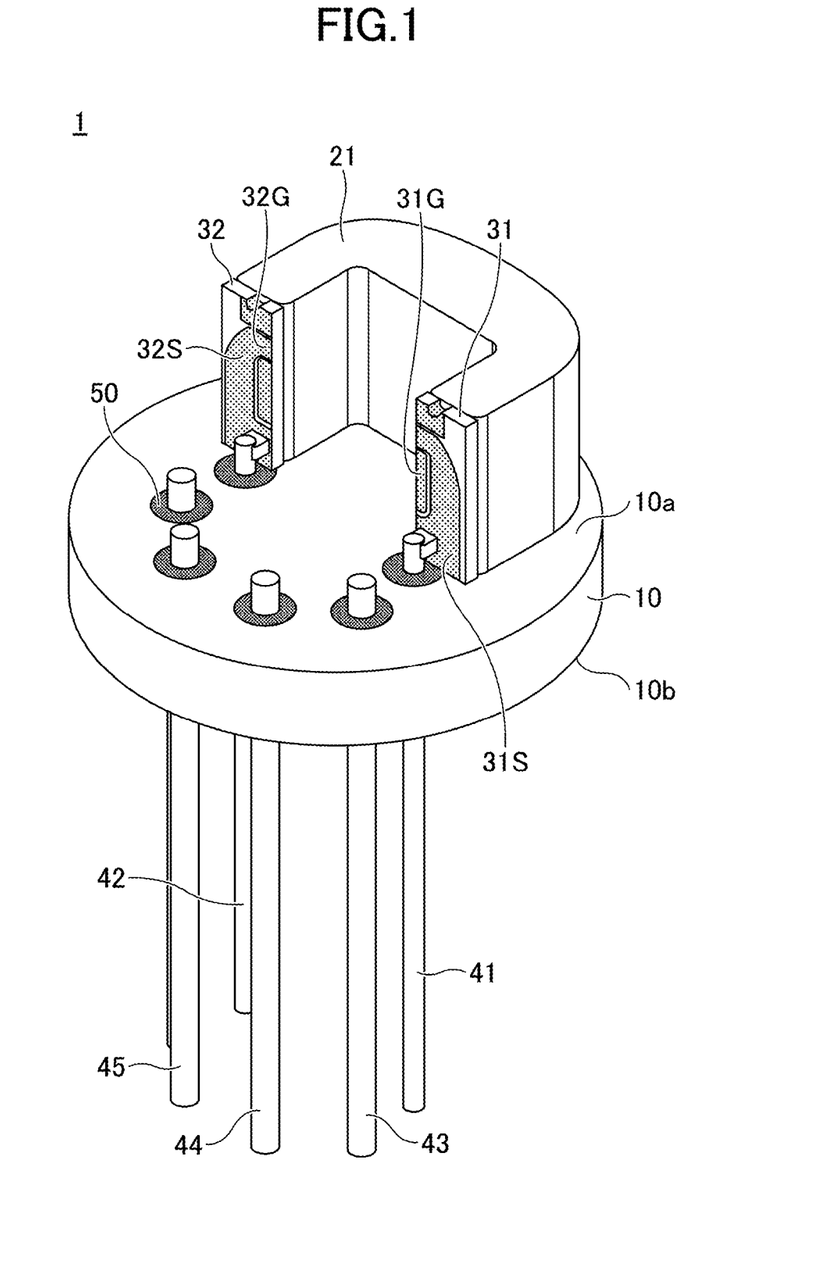
FIG. 1 is a perspective view (part 1) illustrating an example of a header for a semiconductor package according to a first embodiment.
Figure 2:
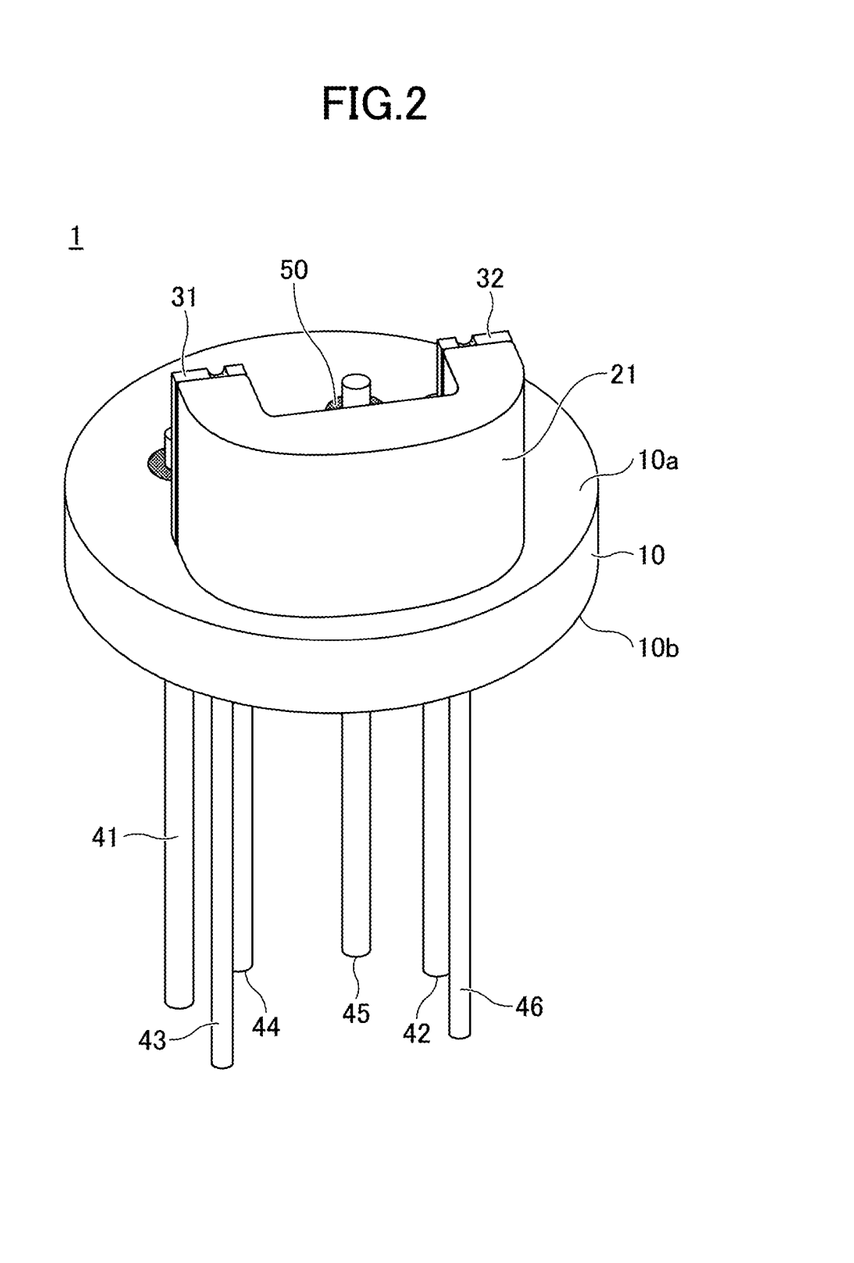
FIG. 2 is a perspective view (part 2) illustrating the example of the header for the semiconductor package according to the first embodiment.
Figure 3:
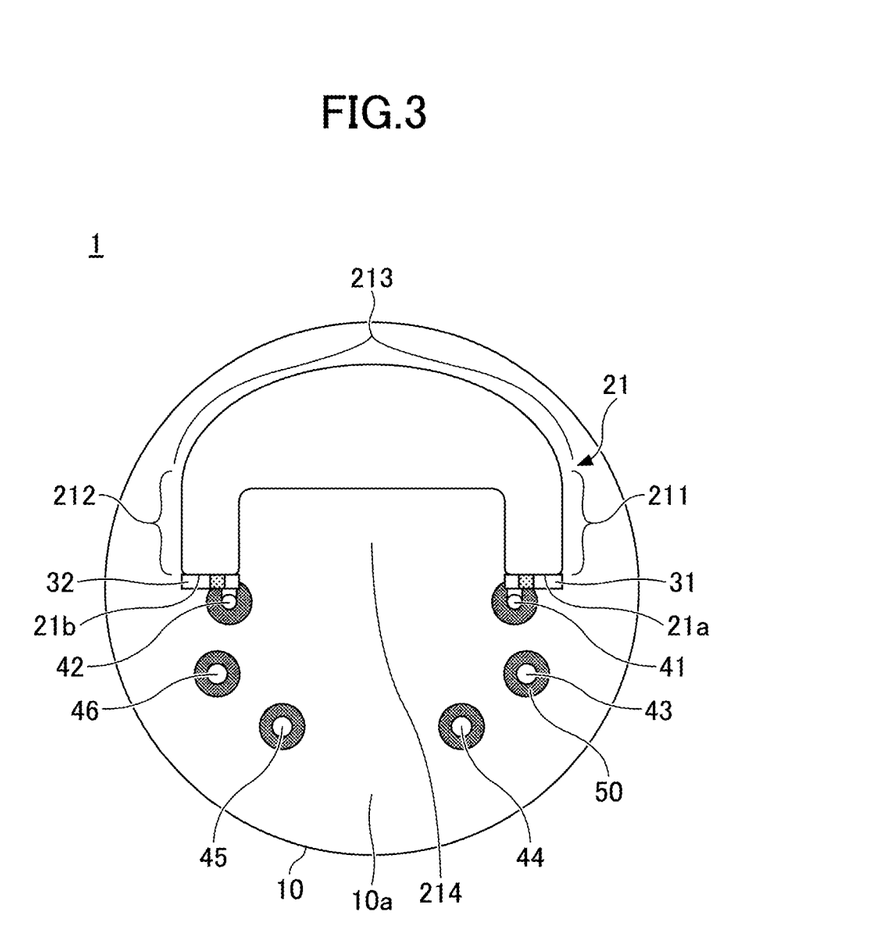
FIG. 3 is a plan view illustrating the example of the header for the semiconductor package according to the first embodiment.

FIG. 1 is a perspective view (part 1) illustrating an example of a header 1 for a semiconductor package according to a first embodiment, and illustrates the header 1 for the semiconductor package viewed from the front surface side of a first substrate and a second substrate. FIG. 2 is a perspective view (part 2) illustrating the example of the header 1 for the semiconductor package according to the first embodiment, and illustrates the header 1 for the semiconductor package viewed from the back surface side of the first substrate and the second substrate. FIG. 3 is a plan view illustrating the example of the header 1 for the semiconductor package according to the first embodiment.

As illustrated in FIG. 1 through FIG. 3, the header 1 for the semiconductor package according to the first embodiment includes an eyelet 10, a first metal block 21, a first substrate 31, a second substrate 32, a first lead 41, a second lead 42, a third lead 43, a fourth lead 44, a fifth lead 45, a sixth lead 46, and sealers 50. The header 1 for the semiconductor package may be used as a header for a Directly Modulated Laser (DML), for example.

The eyelet 10 is a member having a disk shape. The diameter of the eyelet 10 is not particularly limited. The diameter of the eyelet 10 may be appropriately determined according to the purpose, and may be φ3.8 mm, φ5.6 mm, or the like, for example. The thickness of the eyelet 10 is not particularly limited, and may be appropriately determined according to the purpose. The thickness of the eyelet 10 may be approximately 1.0 mm to approximately 1.5 mm, for example. The eyelet 10 may be made of a metal material such as iron that can be stamped, for example.

In the present application, a disk shape refers to a shape of which the planar shape is approximately circular having a predetermined thickness. The size of the thickness with respect to the diameter of a disk shape is not particularly limited. Also, as a disk shape, a shape on which a protruding portion, a recessed portion, a through hole, or the like is partially formed may be included. Also, in the present application, a plan view refers to a view of an object viewed from a normal direction to an upper surface 10a of the eyelet 10, and the planar shape refers to a shape of the object viewed from the normal direction to the upper surface 10a of the eyelet 10.

At least one cutout may be formed on an outer edge portion of the eyelet 10. In a plan view, the cutout may have a shape recessed from the outer periphery towards the center of the eyelet 10. The cutout may be a recess of which the planar shape is approximately triangular or approximately rectangular, for example. The cutout may be used for positional alignment or the like of a device mounting surface when mounting a semiconductor device on the header 1 for the semiconductor package, for example. Further, the cutout may be used for positional alignment or the like of the header 1 for the semiconductor package in a rotating direction, for example.

The first metal block 21 is molded integrally with the eyelet 10 and is a member protruding at the upper surface 10a of the eyelet 10. The first metal block 21 may be formed integrally with the eyelet 10 by cold forging pressing or the like using a metal material, such as iron, for example. The first metal block 21 has sidewall portions 211 and 212 arranged at a predetermined interval and a connection portion 213 connecting the end portions on the same side of the sidewall portions 211 and 212. The sidewall portions 211 and 212 and the connection portion 213 form a recessed portion 214 that is recessed from the first lead 41 side and the second lead 42 side in the outer peripheral direction of the eyelet 10.

That is, the first metal block 21 has a substantially U shape when viewed from the normal direction of the upper surface 10a of the eyelet 10. Here, a substantially U shape may be a structure that includes two sidewall portions arranged at a predetermined interval and a connection portion connecting end portions on the same side of the respective sidewall portions to form a recessed portion where a predetermined member can be surrounded in three directions by the respective sidewall portions and the connection portion, and the shape of the details is not particularly limited.

For example, the recessed portion 214 may be rectangular in plan view, semicircular in plan view, or semi-elliptical in plan view. Also, no specific relationship is required for the length and the width of each of the sidewall portions and the connection portion. Also, the width of each of the sidewall portions and the connection portion may be substantially constant even the height from the upper surface 10a of the eyelet 10 varies and may not be strictly constant.

An end surface of the first metal block 21 facing the first lead 41 is a substrate fixing surface 21a for fixing the first substrate 31. An end surface of the second metal block 22 facing the second lead 42 is a substrate fixing surface 22a for fixing the second substrate 32. The substrate fixing surfaces 21a and 22a are arranged to be approximately perpendicular to the upper surface 10a of the eyelet 10, for example. The substrate fixing surface 21a and the substrate fixing surface 22a face the same direction, and are positioned on the same plane, for example.

It should be noted that the substrate fixing surfaces 21a and 21b are required to have planarity enough to fix the substrates, but a substrate or the like is not fixed to the inner wall surface of the recessed portion 214 of the first metal block 21. Therefore, the inner wall surface of the recessed portion 214 of the first metal block 21 may be a rough surface with irregularities or the like.

The first substrate 31 is fixed to the substrate fixing surface 21a. A signal pattern 31S and a ground pattern 31G are provided on a front surface (a surface facing the first lead 41) of the first substrate 31. A ground pattern 31G is provided on a back surface (a surface facing the first metal block 21) of the first substrate 31, as a solid layer. The ground pattern 31G on the front surface of the first substrate 31 and the ground pattern 31G on the back surface of the first substrate 31 are electrically connected via a through hole penetrating the first substrate 31.

The second substrate 32 is fixed to the substrate fixing surface 22a. A signal pattern 32S and a ground pattern 32G are provided on a front surface (a surface facing the second lead 42) of the second substrate 32. A ground pattern 32G is provided on a back surface (a surface facing the first metal block 21) of the second substrate 32, as a solid layer. The ground pattern 32G on the front surface of the second substrate 32 and the ground pattern 32G on the back surface of the second substrate 32 are electrically connected via a through hole penetrating the second substrate 32.

The back surface side of the first substrate 31 is fixed to the substrate fixing surface 21a by a conductive material, such as a brazing material (for example, a gold-tin alloy). The back surface side of the second substrate 32 is fixed to the substrate fixing surface 21b by a conductive material, such as a brazing material (for example, a gold-tin alloy). Thereby, the ground pattern 31G on the back surface of the first substrate 31 and the ground pattern 32G on the back surface of the second substrate 32 are electrically connected to the first metal block 21, and the first metal block 21 becomes the GND potential (reference potential).

With reference to the upper surface 10a of the eyelet 10, the height of the first metal block 21 is substantially equal to the height of the first substrate 31 and the second substrate 32. With reference to the upper surface 10a of the eyelet 10, the height of the first metal block 21, the first substrate 31, and the second substrate 32 is 2 mm, for example.

The first substrate 31 and the second substrate 32 may be made of alumina or aluminum nitride, for example. The signal patterns 31S and 32S and the ground patterns 31G and 32G may be made of tungsten, titanium, gold, or the like, for example. A gold plating or the like may be formed on surfaces of the signal patterns 31S and 32S and the ground patterns 31G and 32G.

In the through holes penetrating the eyelet 10 from the upper surface 10a to the lower surface 10b, the first lead 41, the second lead 42, the third lead 43, the fourth lead 44, the fifth lead 45, and the sixth lead 46 are sealed such that their longitudinal directions are directed towards the thickness direction of the eyelet 10. That is, the peripheries of the first lead 41, the second lead 42, the third lead 43, the fourth lead 44, the fifth lead 45, and the sixth lead 46 are sealed in the respective through holes by the sealers 50.

A portion of each of the first lead 41 and the second lead 42 protrudes upward from the upper surface 10a of the eyelet 10. The amount of protrusion is approximately 0 to 0.3 mm, for example. A portion of each of the third lead 43, the fourth lead 44, the fifth lead 45, and the sixth lead 46 protrudes upward from the upper surface 10a of the eyelet 10. The amount of protrusion of the third lead 43, the fourth lead 44, the fifth lead 45, and the sixth lead 46 from the upper surface 10a of the eyelet 10 is approximately 0 to 2 mm, for example.

In addition, a portion of each of the first lead 41, the second lead 42, the third lead 43, the fourth lead 44, the fifth lead 45, and the sixth lead 46 protrudes downward from the lower surface 10b of the eyelet 10. The amount of protrusion of the first lead 41, the second lead 42, the third lead 43, the fourth lead 44, the fifth lead 45, and the sixth lead 46 from the lower surface 10b of the eyelet 10 is approximately 6 mm to 10 mm, for example.

The first lead 41, the second lead 42, the third lead 43, the fourth lead 44, the fifth lead 45, and the sixth lead 46 are made of a metal, such as an iron-nickel alloy or Kovar (registered trademark), for example. The sealers 50 are made of an insulating material, such as a glass material, for example. A gold plating or the like may be formed on surfaces of the first lead 41, the second lead 42, the third lead 43, the fourth lead 44, the fifth lead 45, and the sixth lead 46.

The portion of the first lead 41 protruding upward from the upper surface 10a of the eyelet 10 is electrically connected to the signal pattern 31S of the first substrate 31 by a brazing material (for example, a gold-tin alloy) or the like. In addition, the portion of the second lead 42 protruding from the upper surface 10a of the eyelet 10 is electrically connected to the signal pattern 32S of the second substrate 32 by a brazing material (for example, a gold-tin alloy) or the like.

The first lead 41 and the second lead 42 form a path through which a differential signal passes electrically connected to a light emitting device mounted on the header 1 for the semiconductor package via the signal patterns 31S and 32S. For example, the third lead 43, the fourth lead 44, the fifth lead 45, and the sixth lead 46 form paths through which a signal passes electrically connected to the ground GND, electrically connected to a Peltier device mounted on the header 1 for the semiconductor package, and electrically connected to a temperature sensor mounted on the header 1 for the semiconductor package. It should be noted that the number of leads is not particularly limited, and the number of leads may be increased or decreased, as needed.

Figure 4:
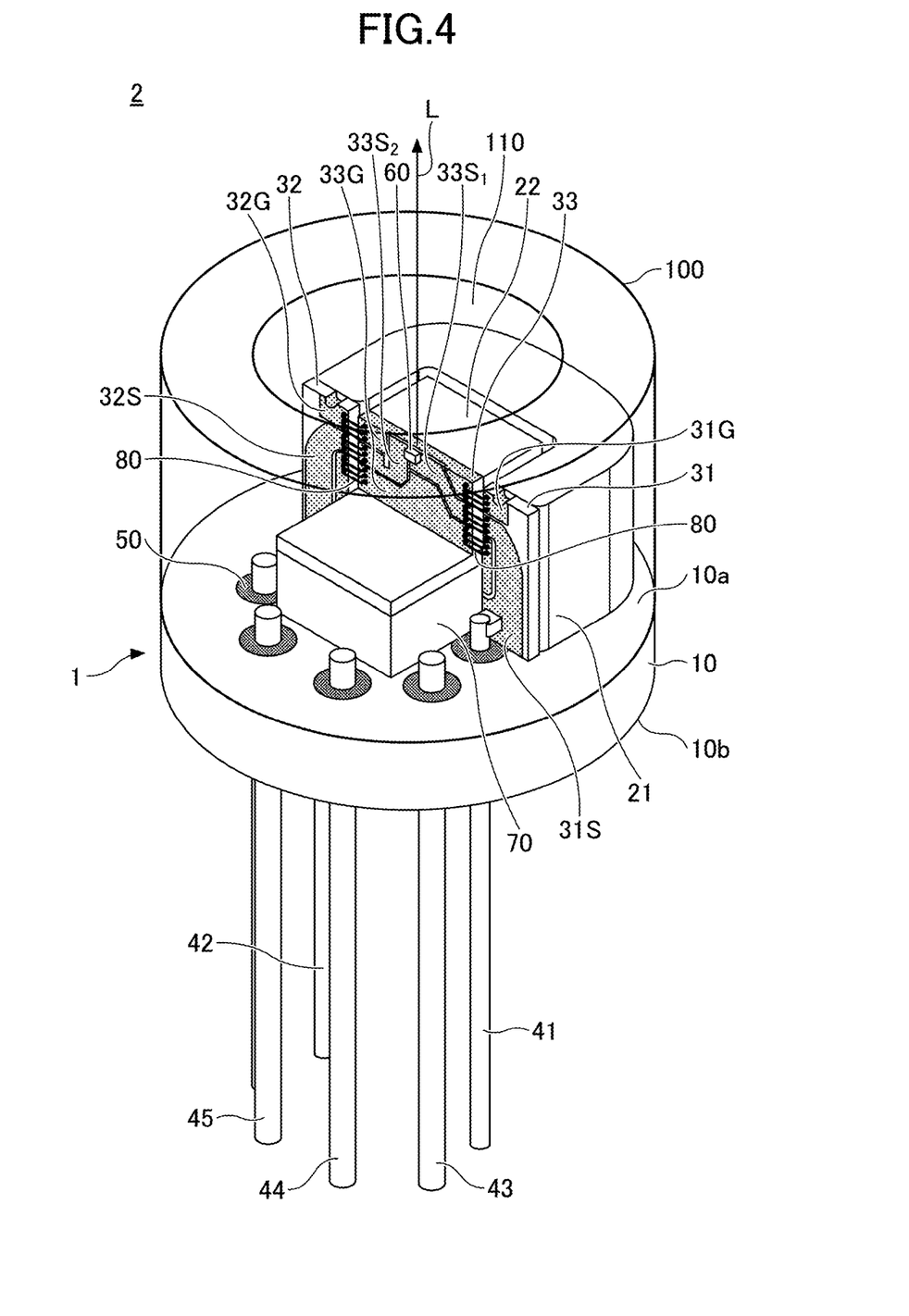
FIG. 4 is a perspective view (part 1) illustrating an example of a semiconductor package according to the first embodiment.
Figure 5:
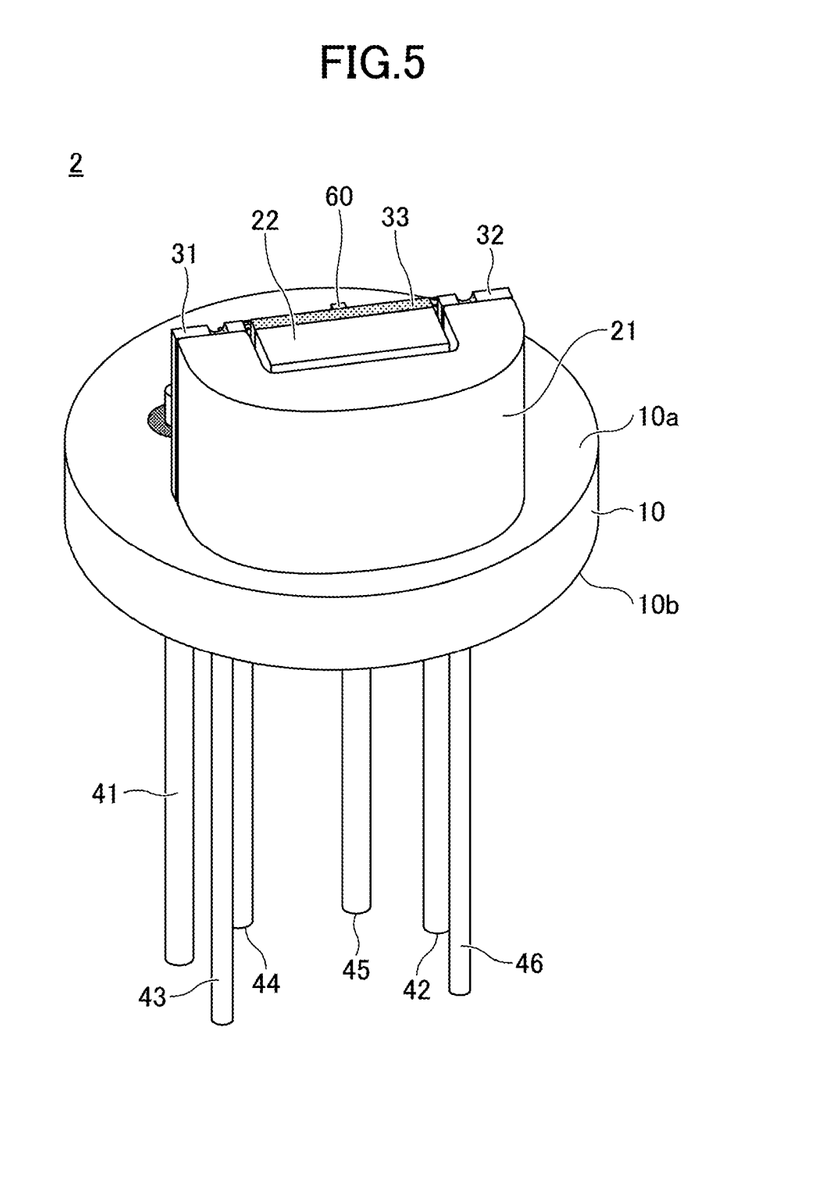
FIG. 5 is a perspective view (part 2) illustrating the example of the semiconductor package according to the first embodiment.
Figure 6:
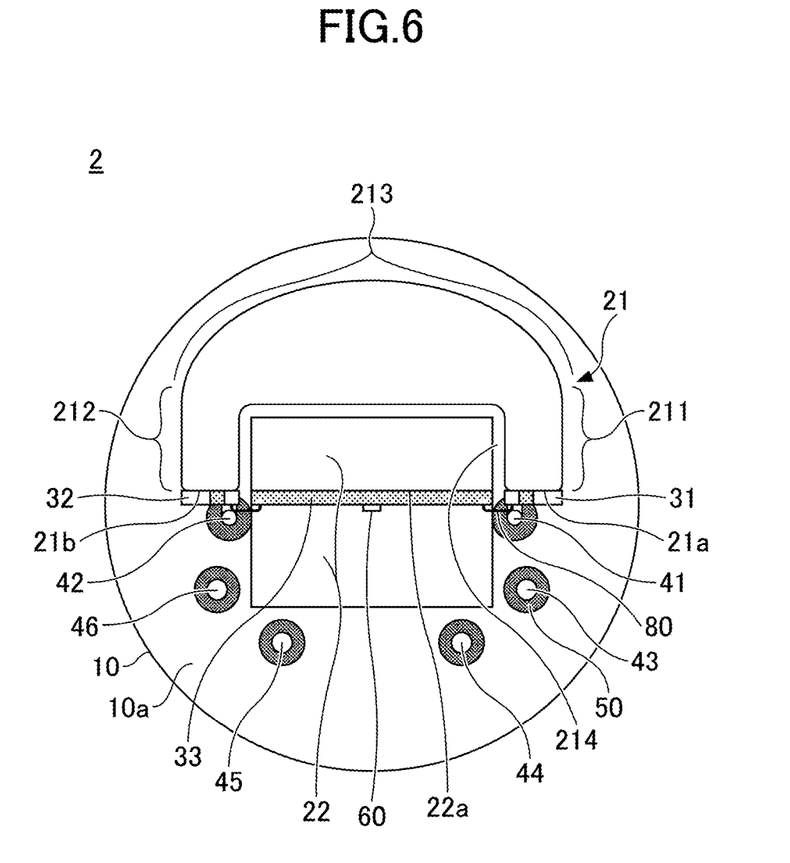
FIG. 6 is a plan view illustrating the example of the semiconductor package according to the first embodiment.

FIG. 4 is a perspective view (part 1) illustrating an example of a semiconductor package 2 according to the first embodiment, and illustrates the semiconductor package 2 viewed from the front surface side of the first substrate and the second substrate. FIG. 5 is a perspective view (part 2) illustrating the example of the semiconductor package 2 according to the first embodiment, and illustrates the semiconductor package 2 viewed from the back surface side of the first substrate and the second substrate. FIG. 6 is a plan view illustrating the example of the semiconductor package 2 according to the first embodiment. It should be noted that in FIG. 4, a cap 100 is illustrated as being transparent for the sake of convenience. The illustration of the cap 100 and a transparent member 110 is omitted in FIG. 5 and FIG. 6.

As illustrated in FIG. 4 through FIG. 6, the semiconductor package 2 according to the first embodiment includes the header 1 for the semiconductor package (refer to FIG. 1 through FIG. 3), a second metal block 22, a third substrate 33, a light emitting device 60, a Peltier device 70, the cap 100, and the transparent member 110.

As illustrated in FIG. 4, in the semiconductor package 2, the cap 100, integral with the transparent member 110, is fixed to the header 1 for the semiconductor package by a resistance welding or the like. The transparent member 110 is a lens, a window, or the like for extracting light L emitted from the light emitting device 60. For example, the cap 100 is made of a metal, such as stainless steel, and hermetically seals therein major components, such as the light emitting device 60 of the header 1 for the semiconductor package.

The Peltier device 70 is arranged on the upper surface 10a of eyelet 10. A portion of the Peltier device 70 is located in the recessed portion 214 so as not to be in contact with the recessed portion 214, and the other portion of the Peltier device 70 protrudes from the recessed portion 214 toward the fourth lead 44 and the fifth lead 45.

The second metal block 22 is a substantially L-shaped member and is fixed on the Peltier device 70. A portion of the second metal block 22 (a portion having a high height) is located in the recessed portion 214 so as not to be in contact with the recessed portion 214, and the other portion of the second metal block 22 (a portion having a low height) protrudes from the recessed portion 214 toward the fourth lead 44 and the fifth lead 45. That is, the second metal block 22 is arranged to be away from the first metal block 21.

The side surface of the second metal block 22 facing the fourth lead 44 and the fifth lead 45 is a substrate fixing surface 22a for fixing the third substrate 33. The substrate fixing surface 22a is provided to be substantially perpendicular to the upper surface 10a of the eyelet 10, for example. The substrate fixing surface 22a faces the same direction as the substrate fixing surfaces 21a and 21b, for example, and is positioned on the same plane as the substrate fixing surfaces 22a and 21b.

The second metal block 22 may be made of a metal material such as, stainless steel, for example. The second metal block 22 is fixed on the Peltier device 70 by a thermally conductive adhesive or the like, for example. For example, the second metal block 22 is substantially L-shaped, but may be of a desired shape.

The third substrate 33 is fixed to the substrate fixing surface 22a. On the front surface of the third substrate 33 (the surface facing the fourth lead 44 and the fifth lead 45), signal patterns $33S_1$ and $33S_2$ and a ground pattern 33G are provided. On the back surface of the third substrate 33 (the surface facing the second metal block 22), a ground pattern 33G is provided as a solid layer. The ground pattern 33G on the front surface of the third substrate 33 and the ground pattern 33G on the back surface of the third substrate 33 are electrically connected through side surfaces of the third substrate 33.

The third substrate 33 is, for example, made of aluminum nitride. The signal patterns $33S_1$ and $33S_2$ and the ground patterns 33G may be made of tungsten, titanium, gold, or the like, for example. A gold plating or the like may be formed on the surfaces of the signal patterns $33S_1$ and $33S_2$ and the ground patterns 33G.

On the front surface side of the third substrate 33, the signal pattern $33S_1$ is electrically connected to the signal pattern 31S via a linear member 80. Also, on the front surface side of the third substrate 33, the signal pattern $33S_2$ is electrically connected to the signal pattern 32S via one or more linear members 80. Also, on the front surface side of the third substrate 33, the ground pattern 33G is electrically connected to the ground patterns 31G and 32G via one or more linear member 80. The number of linear members 80 for each connection may be a desired number of one or more. The linear members 80 are not particularly limited but may be a member that is linear such as a bonding wire, for example. Other examples of the linear members 80 include ribbons. Also, metal wires or the like may be joined using solder.

The signal patterns $33S_1$ and $33S_2$ are electrically connected to terminals of the light emitting device 60 mounted on the surface of the third substrate 33. For a differential drive circuit that drives the light emitting device 60, two systems of the signal patterns $33S_1$ and $33S_1$ are required for the input lines of drive signals. A positive phase signal is input to one of the signal patterns $33S_1$ and $33S_2$, and a negative phase signal obtained by inverting the positive phase signal is input to the other of the signal patterns $33S_1$ and $33S_2$. It should be noted that the light emitting device 60 is a semiconductor laser chip having a wavelength of 1310 nm, for example.

The back surface side of the third substrate 33 is fixed to the substrate fixing surface 22a by an electrically conductive material such as a brazing material (e.g., a gold-tin alloy). Accordingly, the ground pattern 33G on the back surface of the third substrate 33 is electrically connected with the second metal block 22, and the second metal block 22 becomes at the GND potential (reference potential).

Figure 7:
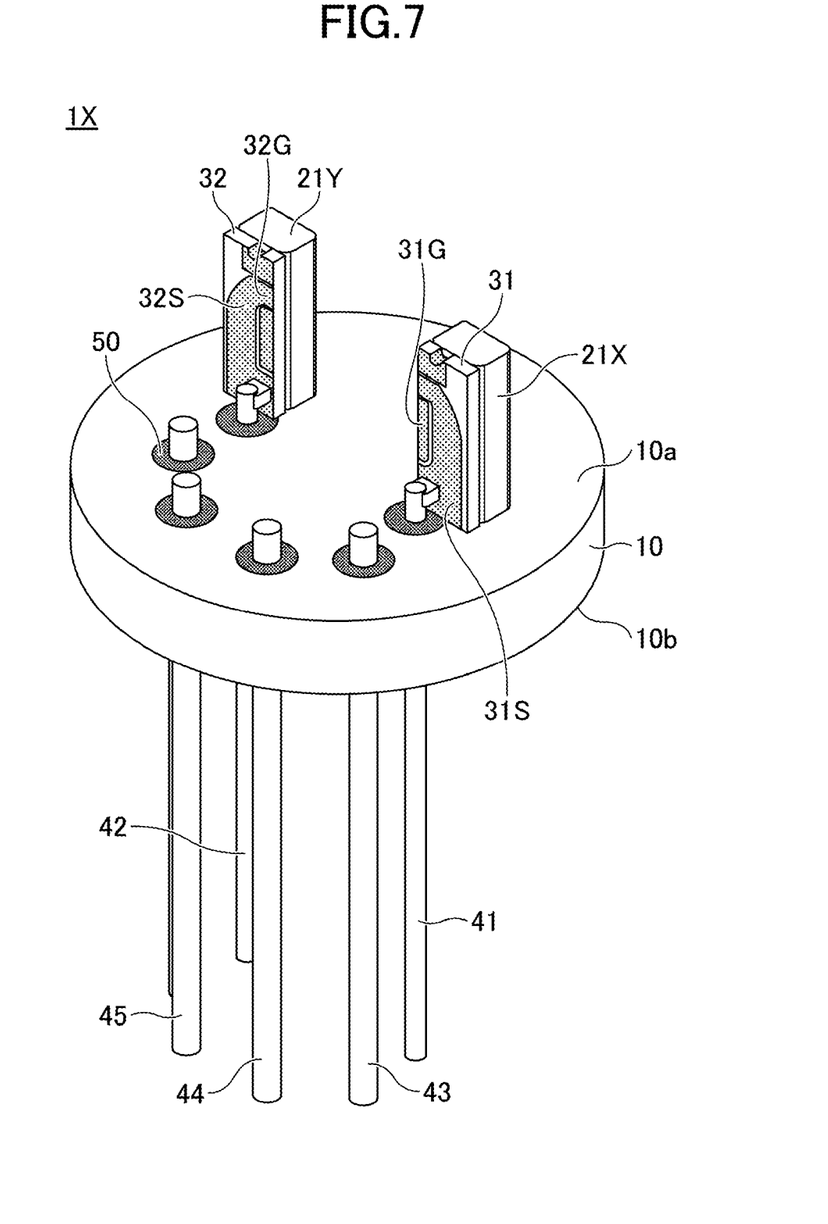
FIG. 7 is a perspective view illustrating an example of a header for a semiconductor package according to a comparative example.

FIG. 7 is a perspective view illustrating a stem 1X for a semiconductor package according to a comparative example. Referring to FIG. 7, the stem 1X for the semiconductor package stem according to the comparative example differs from the header 1 for the semiconductor package stem (see FIG. 1 to FIG. 3) in that the first metal block 21 is separated into a metal block 21X and a metal block 21Y.

In order to form the eyelet 10 and the metal blocks 21X and 21Y integrally, it is necessary to adjust the flow rate of the metal material into the mold for each of the metal blocks 21X and 21Y. However, adjusting the flow rate of the metal material into the mold is almost impossible because the pressing speed is high, i.e., the plastic deformation speed of the metal material is high. For example, if one of the metal blocks 21X and 21Y is attempted to be filled with the metal material, the other of the metal blocks 21X and 21Y may be insufficiently filled or excessively filled with the metal material, and excessive filling may cause damage to the mold.

Thus, it is extremely difficult to form the two metal blocks 21X and 21Y, which are away from each other and protruding on the eyelet 10, integrally with the eyelet 10.

In contrast, in the header 1 for the semiconductor package, the first substrate 31 and the second substrate 32 are fixed to the substrate fixing surfaces 21a and 22a of the single first metal block 21. That is, because a metal block to be formed integrally with the eyelet 10 is only the first metal block 21, there is no need to adjust the flow rate of the metal material into the mold as described above, and the first metal block 21 has a shape that can be formed integrally with the eyelet 10. As a result, the header 1 for the semiconductor package can be supplied inexpensively.

First Modified Example of the First Embodiment

As a first modified example of the first embodiment, an example of a header for a semiconductor package having a different structure from the first embodiment is described. It should be noted that in the first modified example of the first embodiment, the description of elements that are the same as those of the embodiment described above may be omitted.

Figure 8:
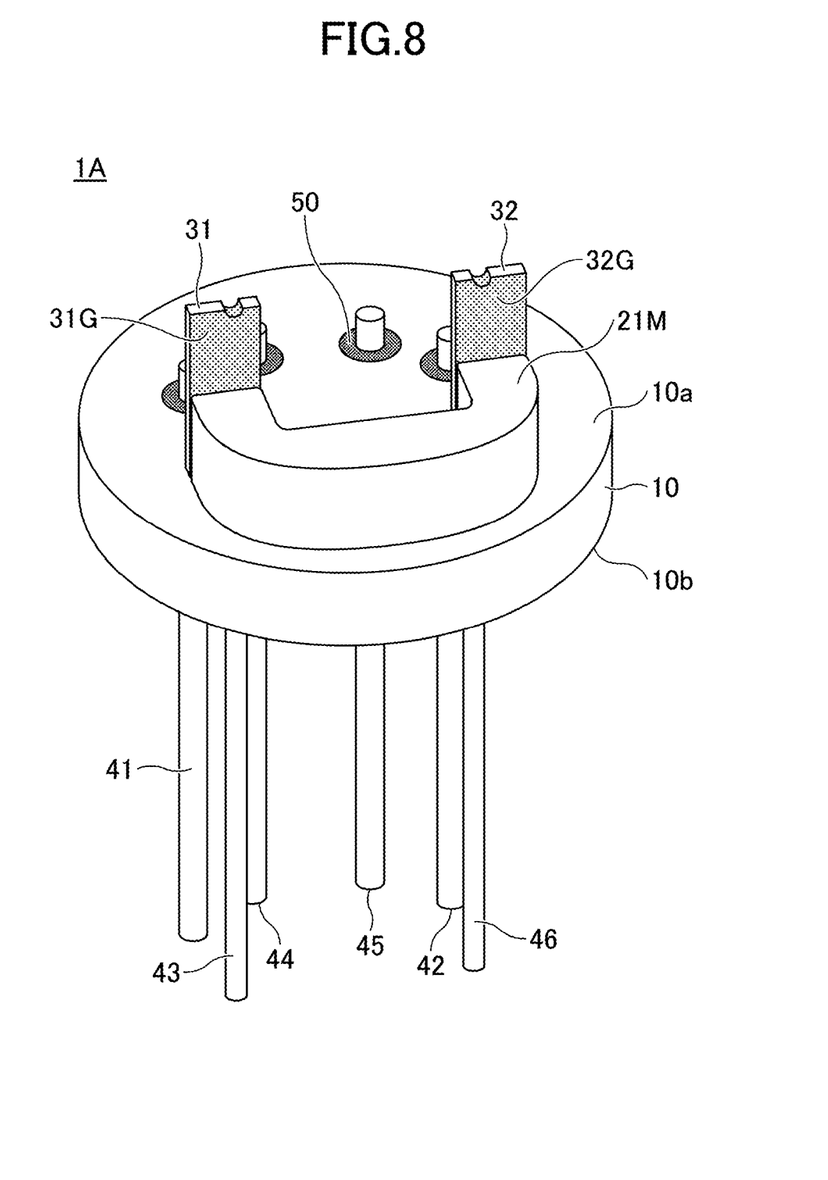
FIG. 8 is a perspective view illustrating an example of a header for a semiconductor package according to a first modified example of the first embodiment.

FIG. 8 is a perspective view illustrating an example of a stem 1A for a semiconductor package according to the first modified example of the first embodiment, and illustrates the stem 1A for the semiconductor package viewed from the back surface side of a first substrate and a second substrate.

Referring to FIG. 8, the stem 1A for the semiconductor package according to the first modified example of the first embodiment differs from the header 1 for the semiconductor package (see FIG. 1 to FIG. 3) in that the first metal block 21 is replaced with a first metal block 21M.

The height of the first metal block 21M is lower than the height of the first metal block 21 with reference to the upper surface 10a of the eyelet 10. That is, the height of the first metal block 21M is lower than the height of the first substrate 31 and the second substrate 32 with reference to the upper surface 10a of the eyelet 10. Therefore, at least a portion of the ground pattern 31G on the back surface of the first substrate 31 and at least a portion of the ground pattern 32G on the back surface of the second substrate 32 are exposed from the first metal block 21M, and wire bonding or the like can be performed on the exposed portions later.

It is preferable that the height of the first metal block 21M with reference to the upper surface 10a of the eyelet 10 is ½ or more the height of the first substrate 31 and the second substrate 32, considering the ease of attaching the first substrate 31 and the second substrate 32. For example, in case in which the height of the first substrate 31 and the second substrate 32 with reference to the upper surface 10a of the eyelet 10 is 2 mm, the height of the first metal block 21M is preferably 1 mm or more.

As described above, because the height of the first metal block 21M of the stem 1A for the semiconductor package is lower than the height of the first metal block 21 of the header 1 for the semiconductor package with reference to the upper surface 10a of the eyelet 10, forming integrally with the eyelet 10 is further easy.

Figure 9:
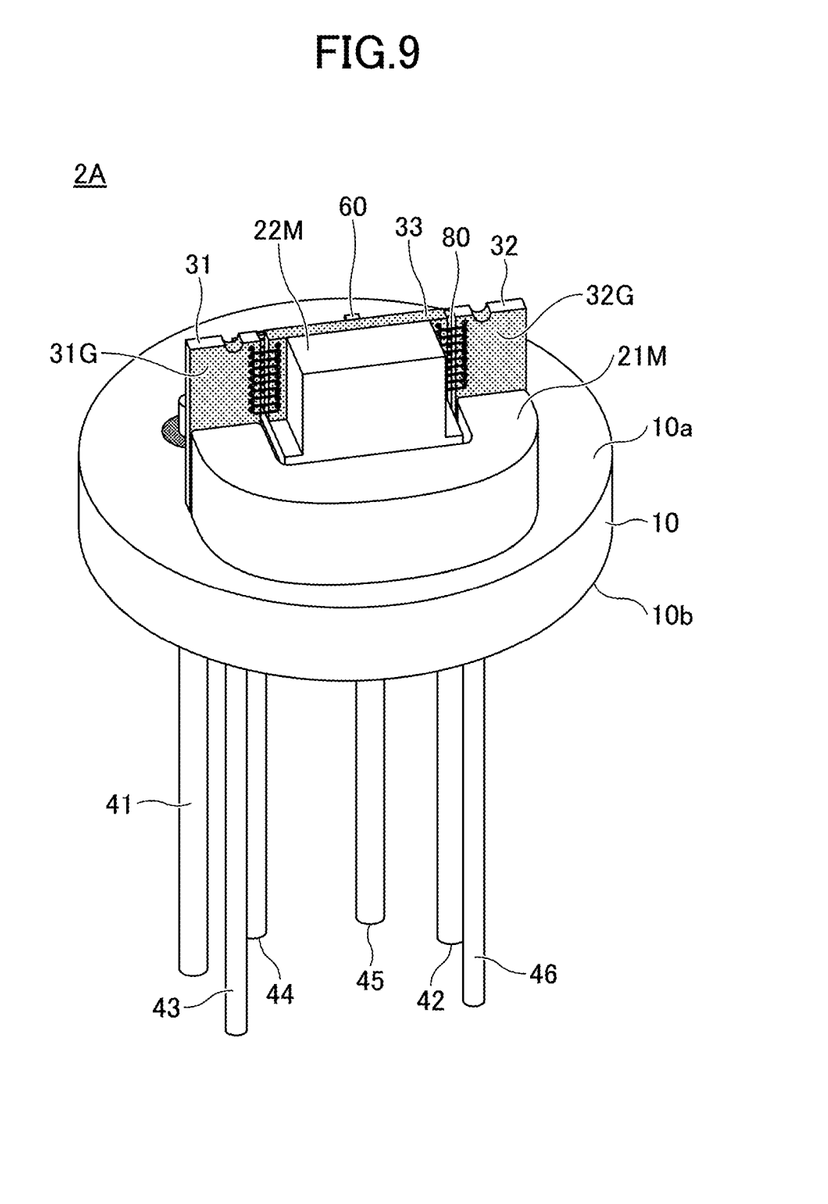
FIG. 9 is a perspective view illustrating an example of a semiconductor package according to the first modified example of the first embodiment.
Figure 10:
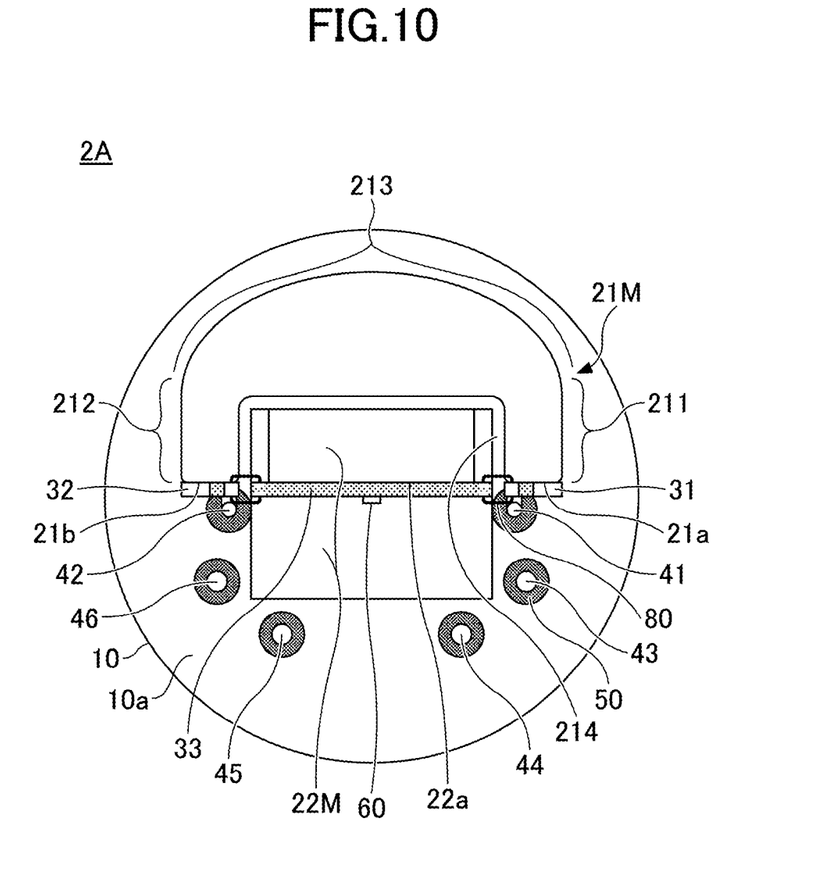
FIG. 10 is a plan view illustrating the example of the semiconductor package according to the first modified example of the first embodiment.

FIG. 9 is a perspective view illustrating a semiconductor package 2A according to the first modified example of the first embodiment, and illustrates the semiconductor package 2A viewed from the back surface side of the first substrate and the second substrate. FIG. 10 is a plan view illustrating the semiconductor package 2A according to the first modified example of the first embodiment. It should be noted that in FIG. 9 and FIG. 10, a cap 100 and a transparent member 110 similar to those of FIG. 4 are present, but their illustration is omitted.

Referring to FIG. 9 and FIG. 10, the semiconductor package 2A according to the first modified example of the first embodiment differs from the semiconductor package 2 (see FIG. 4 to FIG. 6) in that the first metal block 21 is replaced with the first metal block 21M and the second metal block 22 is replaced with a second metal block 22M.

In the second metal block 22M, unlike the second metal block 22, the width of the substrate fixing surface 22a is formed to be narrower than the width of the third substrate 33, and the third substrate 33 is fixed to the substrate fixing surface 22a such that both sides of the back surface (on the first substrate 31 side and on the second substrate 32 side) of the third substrate 33 protrude on both sides of the second metal block 22M. Therefore, the ground pattern 33G on the back surface of the third substrate 33 is at least partially exposed from the first substrate 31 side and the second substrate 32 side of the second metal block 22M.

The ground pattern 33G formed on the back surface of the third substrate 33 exposed from the first substrate 31 side of the second metal block 22M and the ground pattern 31G formed on the back surface of the first substrate 31 exposed from the first metal block 21M are electrically connected to each other via one or more linear members 80. The number of linear members 80 connecting the ground pattern 33G and the ground pattern 31G on the back surface side of the third substrate 33 and the first substrate 31 may be any number that is greater than or equal to one, and is preferably two or more from the viewpoint of the stability of the GND potential.

It should be noted that number of linear members 80 connecting the ground pattern 33G and the ground pattern 31G on the back surface side of the third substrate 33 and the first substrate 31 is preferably less than or equal to ten. This is for preventing heat, caused by operation of the light emitting device 60 moved by the Peltier device 70, from returning to the light emitting device 60 via the first substrate 31 and the third substrate 33.

The ground pattern 33G formed on the back surface of the third substrate 33 exposed from the second substrate 32 side of the second metal block 22M and the ground pattern 32G formed on the back surface of the second substrate 32 exposed from the first metal block 21M are electrically connected to each other via one or more linear members 80. The number of linear members 80 connecting the ground pattern 33G and the ground pattern 32G on the back surface side of the third substrate 33 and the second substrate 32 may be any number that is greater than or equal to one, and is preferably two or more from the viewpoint of the stability of the GND potential.

It should be noted that number of linear members 80 connecting the ground pattern 33G and the ground pattern 32G on the back surface side of the third substrate 33 and the second substrate 32 is preferably less than or equal to ten. This is for preventing heat, caused by operation of the light emitting device 60 moved by the Peltier device 70, from returning to the light emitting device 60 via the second substrate 32 and the third substrate 33.

Thus, in the semiconductor package 2A, at least a portion of the ground pattern 31G on the back surface of the first substrate 31 and at least a portion of the ground pattern 32G on the back surface of the second substrate 32 are exposed from the first metal block 21M. Also, a least a portion of the ground pattern 33G on the back surface of the third substrate 33 is exposed from the first substrate 31 side and the second substrate 32 side of the second metal block 22M.

Then, the ground pattern 31G on the back surface of the first substrate 31 exposed from the first metal block 21M and the ground pattern 33G on the back surface of the third substrate 33 exposed from the first substrate 31 side of the second metal block 22M are electrically connected to each other through one or more linear members 80. Also, the ground pattern 32G on the back surface of the second substrate 32 exposed from the first metal block 21M and the ground pattern 33G on the back surface of the third substrate 33 exposed from the second substrate 32 side of the second metal block 22M are electrically connected to each other via one or more linear members 80.

That is, instead of electrically connecting the back surfaces of metal blocks with a linear member as in a conventional technique, the ground pattern 31G on the back surface of the first substrate 31, the ground pattern 32G on the back surface of the second substrate 32, and the ground pattern 33G on the back surface of the third substrate 33 are electrically connected with one or more linear members. Therefore, because the ground patterns on the different substrates can be connected to each other at the shortest without interposing a metal block, the electrical characteristics can be further improved.

In addition, for the connection between the ground pattern 31G on the back surface of the first substrate 31 and the ground pattern 33G on the back surface of the third substrate 33, for example, even a single bonding wire having a diameter of 25 μm can enhance the electrical characteristics. Similarly, for the connection between the ground pattern 32G on the back surface of the second substrate 32 and the ground pattern 33G on the back surface of the third substrate 33, for example, even a single bonding wire having a diameter of 25 μm can enhance the electrical characteristics.

Therefore, without unnecessarily increasing the number of metal wires to be added to the back surface side of each substrate, it is possible to suppress heat from returning to the light emitting device through a linear member to be added to the back surface side of each substrate. It should be noted that a plurality of linear members may be used to connect the ground patterns of different substrates to each other if the required specifications are satisfied as a semiconductor package. In this case, further improvement of electrical characteristics is expected.

Also, it is preferable that the first substrate 31 and the second substrate 32 are made of a material having lower thermal conductivity than a material of the third substrate 33. Thereby, it is possible to further prevent heat caused by operation of the light emitting device 60 moved by the Peltier device 70 from returning to the light emitting device 60 via the first substrate 31 and the second substrate 32. In order to obtain such effects, for example, the first substrate 31 and the second substrate 32 may be made of alumina, and the third substrate 33 may be made of aluminum nitride.

It should be noted that in a case in which a bonding wire is used as a linear member 80, the electrical characteristics are improved by thickening the bonding wire, but heat return is likely to occur. In view of improvement of the electrical characteristics and the return of heat, it is preferable that the diameter of the bonding wire be about 25 μm.

Although preferable embodiments have been described above in detail, the present disclosure is not limited to the embodiments described above, and various modifications and substitutions may be made for the embodiments described above without departing from the scope of claims.

All examples and conditional language provided herein are intended for pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority or inferiority of the invention. Although one or more embodiments of the present invention have been described in detail, it should be understood that the various changes, substitutions, and alterations could be made hereto without departing from the spirit and scope of the invention.

What is claimed is:

1. A header for a semiconductor package comprising:
   an eyelet having an upper surface and a lower surface;
   a first metal block molded integrally with the eyelet, protruding at the upper surface of the eyelet, and having a substantially U shape viewed from a normal direction of the upper surface of the eyelet;
   a first lead sealed in a first through hole penetrating the eyelet from the upper surface to the lower surface of the eyelet;
   a first substrate having a front surface formed with a first signal pattern electrically connected to the first lead and having a back surface that is an opposite side surface of the front surface, the back surface being fixed to a first end surface of the first metal block;
   a second lead sealed in a second through hole penetrating the eyelet from the upper surface to the lower surface of the eyelet; and
   a second substrate having a front surface formed with a second signal pattern electrically connected to the second lead and having a back surface that is an opposite side surface of the front surface of the second substrate, the back surface of the second substrate being fixed to a second end surface of the first metal block,
   wherein a first portion that is a portion of the back surface of the first substrate and a second portion that is a portion of the back surface of the second substrate are exposed from the first metal block, and
   wherein a ground pattern is formed on the first portion of the first substrate and a ground pattern is formed on the second portion of the second substrate.

2. The header for semiconductor package as claimed in claim 1, wherein with reference to the upper surface of the eyelet, a height of the first metal block is lower than a height of the first substrate and the second substrate.

3. A semiconductor package comprising:
   the header for the semiconductor package as claimed in claim 1;
   a Peltier device arranged on the upper surface of the eyelet and away from the first metal block, at least a portion of the Peltier device being located inside the U shape of the first metal block;
   a second metal block arranged on the Peltier device and away from the first metal block, at least a portion of the second metal block being located inside the U shape of the first metal block, the second metal block having a side surface facing a direction that is same as the first end surface and the second end surface; and
   a third substrate having a front surface on which a light emitting device is mounted, and a back surface that is an opposite side surface of the front surface of the third substrate, the back surface of the third substrate being fixed to the side surface of the second metal block,
   wherein a third portion that is a portion of the back surface of the third substrate is exposed from the second metal block,
   wherein a ground pattern is formed on the third portion of the third substrate, and
   wherein the ground pattern formed on the first portion of the first substrate, the ground pattern formed on the second portion of the second substrate, and the ground pattern formed on the third portion of the third substrate are electrically connected via a linear member.

4. The semiconductor package as claimed in claim 3, wherein the ground pattern formed on the first portion of the first substrate, the ground pattern formed on the second portion of the second substrate, and the ground pattern formed on the third portion of the third substrate are electrically connected via a plurality of linear members.

5. A semiconductor package comprising:
   a header for the semiconductor package including:
      an eyelet having an upper surface and a lower surface;
      a first metal block molded integrally with the eyelet, protruding at the upper surface of the eyelet, and having a substantially U shape viewed from a normal direction of the upper surface of the eyelet;
      a first lead sealed in a first through hole penetrating the eyelet from the upper surface to the lower surface of the eyelet;
      a first substrate having a front surface formed with a first signal pattern electrically connected to the first lead and having a back surface that is an opposite side surface of the front surface, the back surface being fixed to a first end surface of the first metal block;
      a second lead sealed in a second through hole penetrating the eyelet from the upper surface to the lower surface of the eyelet; and
      a second substrate having a front surface formed with a second signal pattern electrically connected to the second lead and having a back surface that is an opposite side surface of the front surface of the second substrate, the back surface of the second substrate being fixed to a second end surface of the first metal block;
   a Peltier device arranged on the upper surface of the eyelet and away from the first metal block, at least a portion of the Peltier device being located inside the U shape of the first metal block;
   a second metal block arranged on the Peltier device and away from the first metal block, at least a portion of the second metal block being located inside the U shape of the first metal block, the second metal block having a side surface facing a direction that is same as the first end surface and the second end surface; and
   a third substrate having a front surface on which a light emitting device is mounted, and a back surface that is an opposite side surface of the front surface of the third substrate, the back surface of the third substrate being fixed to the side surface of the second metal block.

6. The semiconductor package as claimed in claim 5, wherein the first substrate and the second substrate are made of a material having a thermal conductivity lower than a thermal conductivity of a material of the third substrate.

7. The semiconductor package as claimed in claim 6, wherein the first substrate and the second substrates are made of alumina, and the third substrate is made of aluminum nitride.

* * * * *